United States Patent
Hwang

(10) Patent No.: US 9,537,049 B2
(45) Date of Patent: Jan. 3, 2017

(54) NANOSTRUCTURE SEMICONDUCTOR LIGHT EMITTING DEVICE

(71) Applicant: Samsung Electronics Co., Ltd., Suwon-si, Gyeonggi-do (KR)

(72) Inventor: Kyung Wook Hwang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/929,612

(22) Filed: Nov. 2, 2015

(65) Prior Publication Data
US 2016/0126412 A1    May 5, 2016

(30) Foreign Application Priority Data
Nov. 3, 2014 (KR) .................. 10-2014-0151520

(51) Int. Cl.
H01L 33/06    (2010.01)
H01L 33/08    (2010.01)
H01L 33/46    (2010.01)
H01L 33/24    (2010.01)
H01L 33/18    (2010.01)

(52) U.S. Cl.
CPC .............. H01L 33/08 (2013.01); H01L 33/24 (2013.01); H01L 33/46 (2013.01); *H01L 33/18* (2013.01)

(58) Field of Classification Search
CPC ........ H01L 33/08; H01L 33/002; H01L 33/46; H01L 33/00
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |

(Continued)

FOREIGN PATENT DOCUMENTS

| | | |
|---|---|---|
| JP | 4927223 B2 | 5/2012 |
| KR | 20120013076 A | 2/2012 |

(Continued)

*Primary Examiner* — Scott B Geyer
(74) *Attorney, Agent, or Firm* — Harness, Dickey & Pierce, P.L.C.

(57) ABSTRACT

There is provided a nanostructure semiconductor light emitting device may including: a base layer formed of a first conductivity-type semiconductor, an insulating layer formed on an upper surface of the base layer and including a first region having a plurality of openings and a plurality of second regions positioned in the plurality of openings and spaced apart from the first region, dielectric nanocores disposed in the plurality of second regions, and a plurality of light emitting nanostructures each including a first conductivity-type semiconductor layer, an active layer, and a second conductivity-type semiconductor layer sequentially disposed on the dielectric nanocores.

20 Claims, 18 Drawing Sheets

(56) References Cited

U.S. PATENT DOCUMENTS

| | | |
|---|---|---|
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 7,998,788 B2 | 8/2011 | Guha et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,410,496 B2 | 4/2013 | Hersee et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,669,125 B2 * | 3/2014 | Lowgren ............... B82Y 20/00 438/22 |
| 8,735,931 B2 | 5/2014 | Han et al. |
| 8,766,295 B2 | 7/2014 | Kim |
| 2010/0283064 A1 | 11/2010 | Samuelson et al. |
| 2011/0169025 A1 | 7/2011 | Kishino et al. |
| 2011/0309382 A1 | 12/2011 | Lowgren |
| 2012/0061641 A1 | 3/2012 | Seong et al. |
| 2012/0153252 A1 | 6/2012 | Kim et al. |
| 2013/0187128 A1 | 7/2013 | Yi et al. |
| 2013/0221385 A1 | 8/2013 | Shibata et al. |
| 2015/0076535 A1 | 3/2015 | Choung |
| 2016/0013365 A1 | 1/2016 | Chun et al. |

FOREIGN PATENT DOCUMENTS

| | | |
|---|---|---|
| KR | 20120040550 A | 4/2012 |
| KR | 20120079310 A | 7/2012 |
| KR | 20130113061 A | 10/2013 |
| KR | 20130121279 A | 11/2013 |
| KR | 2016-0008027 A | 1/2016 |

* cited by examiner

A - A'

B

NANOSTRUCTURE SEMICONDUCTOR LIGHT EMITTING DEVICE

CROSS-REFERENCE TO RELATED APPLICATION

This application claims the priority and benefit of Korean Patent Application No. 10-2014-0151520 filed on Nov. 3, 2014, with the Korean Intellectual Property Office, the disclosure of which is incorporated herein by reference.

TECHNICAL FIELD

The present inventive concepts relate to a nanostructure semiconductor light emitting device.

BACKGROUND

A semiconductor light emitting device such as a light emitting diode (LED) is a device in which materials included therein emit light when electrical power is applied thereto. In an LED, energy generated according to electron-hole recombination is converted into light to be emitted therefrom. LEDs are widely used as light sources in lighting devices and display devices, and as such, the development thereof has tended to be accelerated.

Recently, semiconductor light emitting devices using light emitting nanostructures have been developed as new semiconductor light emitting device technologies. Semiconductor light emitting devices using light emitting nanostructures have improved luminous efficiency, due to a surface area of a light emitting area therein being substantially increased due to light emitting nanostructures, and/or enhanced crystallinity. Also, since an active layer may be obtained from a non-polar plane or a semi-polar plane, a degradation of efficiency due to polarization may be reduced or prevented while droop characteristics may also be improved.

However, since a plurality of light emitting nanostructures may be disposed in a single apparatus, a problem may arise in that light emitted from any one light emitting nanostructure may be absorbed by an adjacent light emitting nanostructure, reducing external light extraction efficiency of the semiconductor light emitting device.

Also, in a light emitting nanostructure, a tip thereof may have a crystal plane different from that of lateral surfaces thereof, and in this case, even though an active layer is grown under the same conditions, the active layer positioned on the tip may have a different composition. Thus, the active layer positioned on the tip light may emit light having a wavelength different from that of other regions. In addition, a semiconductor layer formed on the tip may be relatively thin, leading to a higher possibility of leakage currents being generated.

SUMMARY

An aspect of the present inventive concepts may provide a novel nanostructure semiconductor light emitting device alleviating a problem in which light emitted from any one light emitting nanostructure is absorbed by an adjacent light emitting nanostructure.

An aspect of the present inventive concepts may also provide a novel nanostructure semiconductor light emitting device solving a leakage current problem and alleviating changes in a wavelength of emitted light.

According to an aspect of the present inventive concepts, a nanostructure semiconductor light emitting device may include: a base layer formed of a first conductivity-type semiconductor, an insulating layer formed on an upper surface of the base layer and including a first region having a plurality of openings and a plurality of second regions positioned in the plurality of openings and spaced apart from the first region, dielectric nanocores disposed in the plurality of second regions, and a plurality of light emitting nanostructures each including a first conductivity-type semiconductor layer, an active layer, and a second conductivity-type semiconductor layer sequentially disposed on the dielectric nanocores.

The base layer may be exposed to regions between the first region and the second regions.

The regions between the first region and the second regions may be filled with the first conductivity-type semiconductor layer.

The dielectric nanocores and the insulating layer may be formed of different materials.

The dielectric nanocores may have a multilayer structure.

The multilayer structure may be formed by alternately stacking material layers having different refractive indices.

The multilayer structure may be a distributed Bragg reflector (DBR) structure.

The dielectric nanocores may have a circular or polygonal cross-sectional shape with respect to a plane intersecting therewith, parallel to the insulating layer.

The cross-section of the dielectric nanocores may have substantially the same shape as that of the second regions of the insulating layer.

The dielectric nanocores may be formed of a light-transmissive material.

The dielectric nanocores may have a flat upper surface.

According to another aspect of the present inventive concepts, a nanostructure semiconductor light emitting device may include: a base layer formed of a first conductivity-type semiconductor, a first insulating layer formed on the base layer and including a plurality of openings exposing portions of the base layers, a second insulating layer disposed to be spaced apart from the first insulating layer within the plurality of openings and including a material having the same composition as that of the first insulating layer, dielectric nanocores disposed on the second insulating layer, and a plurality of light emitting nanostructures each including a first conductivity-type semiconductor layer, an active layer, and a second conductivity-type semiconductor layer sequentially disposed on the dielectric nanocores.

A refractive index of the dielectric nanocores may be lower than that of the first conductivity-type semiconductor layer.

The first insulating layer and the second insulating layer may have substantially the same thickness.

The dielectric nanocores may be formed of an insulating material.

According to an aspect of the present inventive concepts, a nanostructure semiconductor light emitting device may include: a base layer, an insulating layer on the base layer, the insulating layer including a plurality of openings exposing the base layer, and a nanocore associated with each of the plurality of openings, wherein a base of each nanocore does not entirely occupy the corresponding opening.

The base of each nanocore may be narrower than the corresponding opening.

The nanostructure semiconductor light emitting device may further include an insulating island on the base layer in each opening, wherein the corresponding nanocore is on the insulating island.

The base of each nanocore need not contact the base layer.

Each nanocore may have a multilayer structure and the multilayer structure may include alternately stacked material layers having different refractive indices.

BRIEF DESCRIPTION OF DRAWINGS

The above and other aspects, features and advantages of the present inventive concepts will be more clearly understood from the following detailed description taken in conjunction with the accompanying drawings, in which.

DETAILED DESCRIPTION

Figure 1:
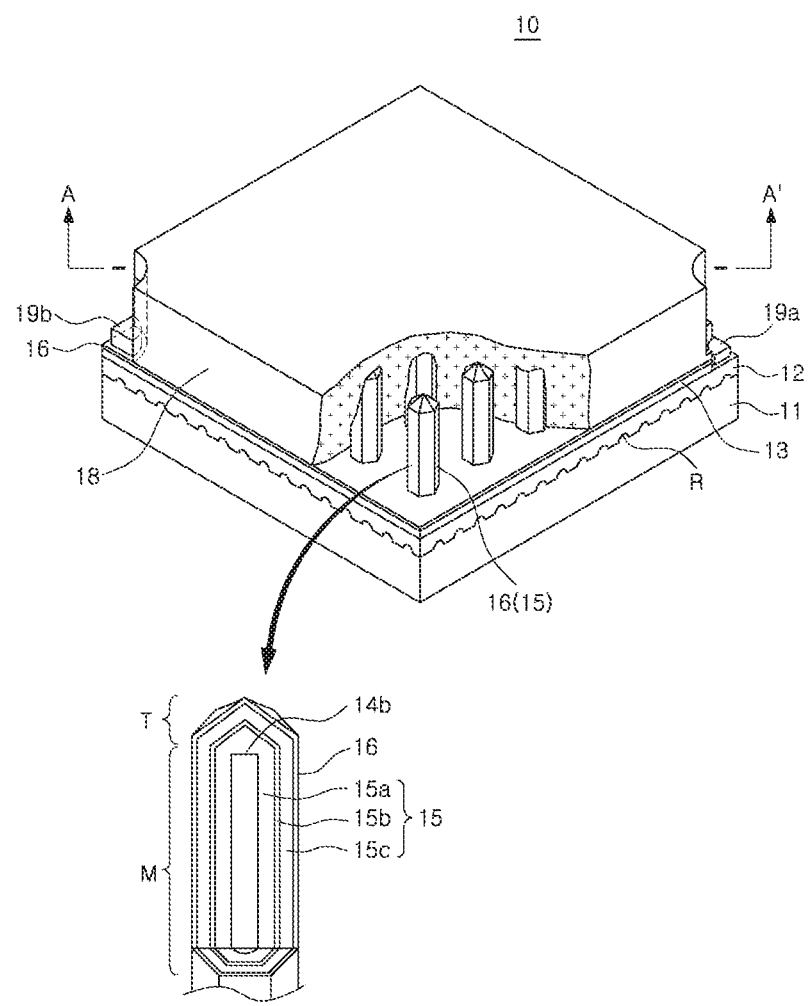
FIG. 1 is a schematic perspective view schematically illustrating a nanostructure semiconductor light emitting device according to an example embodiment of the present inventive concepts.

Various embodiments will now be described more fully with reference to the accompanying drawings in which some embodiments are shown. The present disclosure may, however, be embodied in different forms and should not be construed as limited to the embodiments set forth herein. Rather, these embodiments are provided so that this disclosure is thorough and complete and fully conveys the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Meanwhile, when an embodiment can be implemented differently, functions or operations described in a particular block may occur in a different way from a flow described in the flowchart. For example, two consecutive blocks may be performed simultaneously, or the blocks may be performed in reverse according to related functions or operations.

Figure 2:
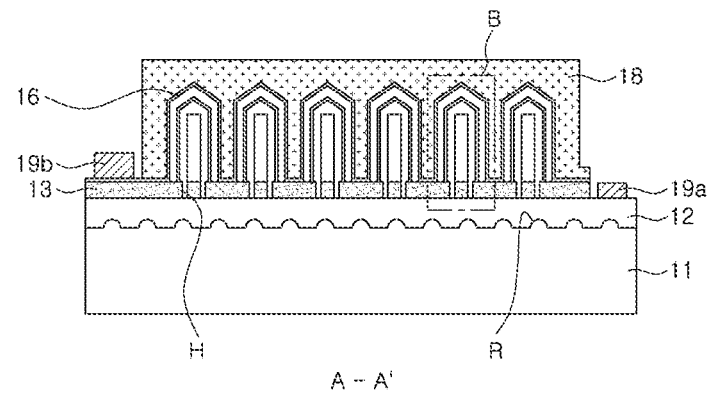
FIG. 2 is a cross-sectional view of the nanostructure semiconductor light emitting device illustrated in FIG. 1, taken along line A-A'.
Figure 3:
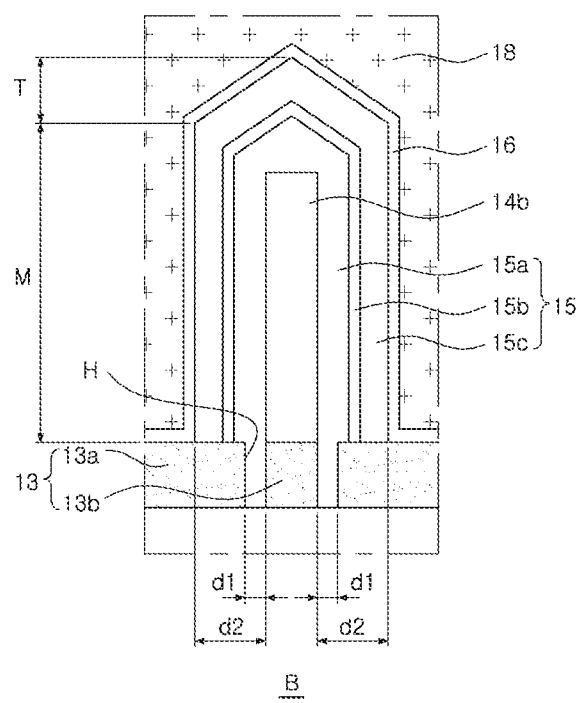
FIG. 3 is an enlarged view of portion "B" of FIG. 2.

FIG. 1 is a schematic perspective view schematically illustrating a nanostructure semiconductor light emitting device according to an example embodiment of the present inventive concepts, FIG. 2 is a cross-sectional view of the nanostructure semiconductor light emitting device illustrated in FIG. 1, taken along line A-A', and FIG. 3 is an enlarged view of portion "B" of FIG. 2.

As illustrated in FIGS. 1 and 2, a nanostructure semiconductor light emitting device 10 according to the present example embodiment may include a base layer 12 formed of a first conductivity-type semiconductor material and a plurality of light emitting nanostructures 15 formed on the base layer 12.

The base layer 12 may be formed on a substrate 11 to provide a growth surface for the light emitting nanostructures 15 and serve to electrically connect polarity of one side of the light emitting nanostructures 15.

The substrate 11 may be an insulating, conductive, or semiconductor substrate. For example, the substrate 11 may be formed of sapphire, SiC, Si, $MgAl_2O_4$, MgO, $LiAlO_2$, $LiGaO_2$, or GaN.

An irregular pattern R may be formed on an upper surface of the substrate 11. The irregular pattern R may improve light extraction efficiency and enhance grown single crystal quality.

The base layer 12 may be a nitride semiconductor satisfying $Al_xIn_yGa_{1-x-y}N$, where $0 \le x < 1$, $0 \le y < 1$, and $0 \le x+y < 1$, and may be doped with an n-type impurity such as silicon (Si) to have a particular conductivity type.

An insulating layer 13 may be formed on the base layer 12, having an opening H allowing a light emitting nanostructure 15 (in particular, a first conductivity-type semiconductor layer 15a) to grow thereon. The insulating layer 13 may be divided into a first region 13a and a second region 13b by the opening H. The base layer 12 is exposed through the opening H. The opening H may be formed to have an interval d1 allowing the base layer 12 to be grown to form the first conductivity-type semiconductor layer 15a of the light emitting nanostructure 15. In an example embodiment, the first region 13a and the second region 13b of the insulating layer 13 may be formed to have the same thickness through a single manufacturing process.

A dielectric nanocore 14b may be disposed in the second region 13b. A lateral surface of the second region 13b forming a portion of the opening H and a lateral surface of the dielectric nanocore 14b may be coplanar, such that a cross-section of the dielectric nanocore 14b has the same shape as that of the second region 13b of the insulating layer 13. The dielectric nanocore 14b will be described in detail hereinafter.

The base layer 12 is exposed through the opening H, and the first conductivity-type semiconductor layer 15a is grown through the exposed region to cover surfaces of the dielectric nanocore 14b. Thus, the insulating layer 13 may be used as a mask for growing the first conductivity-type semiconductor layer 15a. The insulating layer 13 may be formed of an insulating material such as $SiO_x$, $SiN_x$, $Al_2O_3$, HfO, $TiO_2$, or $Ta_2O_3$ that may be used for a semiconductor process.

The light emitting nanostructures 15 may include a first conductivity-type semiconductor 15a, and an active layer 15b and a second conductivity-type semiconductor layer 15c sequentially formed on a surface of the first conductivity-type semiconductor 15a.

The first conductivity-type semiconductor 15a may be a nitride semiconductor layer satisfying n-type $Al_xIn_yGa_{1-x-y}N$, where $0 \le x < 1$, $0 \le y < 1$, and $0 \le x+y < 1$, similar to that of the base layer 12. For example, the first conductivity-type semiconductor 15a may be formed of n-type GaN. The active layer 15b may have a multi quantum well (MQW) structure in which quantum well layers and quantum barrier layers are alternately stacked. For example, in case of a nitride semiconductor, a GaN/InGaN structure may be used. The active layer 15b may also have a single quantum well (SQW) structure. The second conductivity-type nitride semiconductor layer 15c may be a crystal satisfying p-type $Al_xIn_yGa_{1-x-y}N$, where $0 \le x < 1$, $0 \le y < 1$, and $0 \le x+y < 1$.

The nanostructure semiconductor light emitting device 10 may include a contact electrode 16 in ohmic-contact with the second conductivity-type nitride semiconductor layer 15c. The contact electrode 16 employed in example embodiments may be formed of a transparent electrode material to emit light toward the light emitting nanostructures (in the direction opposite to the substrate). For example, the contact electrode 16 may be formed of a transparent electrode material such as indium tin oxide (ITO), and formed of graphene, as needed.

The contact electrode 16 may include materials such as Ag, Ni, Al, Rh, Pd, Ir, Ru, Mg, Zn, Pt, or Au, and may have a structure including two or more layers such as Ni/Ag, Zn/Ag, Ni/Al, Zn/Al, Pd/Ag, Pd/Al, Ir/Ag. Ir/Au, Pt/Ag, Pt/Al, or Ni/Ag/Pt, but the material and structure of the contact electrode 16 are not limited thereto. A reflective electrode structure may be implemented as a flipchip structure, as needed.

The contact electrode 16 may only be formed on a main portion M and may not be formed on the tip portion T of the light emitting nanostructure 14.

An insulating protective layer 18 may be formed on the circumference of the light emitting nanostructure. The insulating protective layer 18 is a passivation layer to protect the light emitting nanostructure 15. Even after the contact electrode 16 is formed, spaces (gaps having a predetermined and/or desired width) may be present between the plurality of light emitting nanostructures 15, and thus, the insulating protective layer 18 may be formed to fill the spaces. The insulating protective layer 18 may be formed of an insulating material such as $SiO_2$ or $SiN_x$. For example, the insulating protective layer 18 may be formed of tetraethylorthosilane (TEOS), borophosphor silicate glass (BPSG), $CVD-SiO_2$, spin-on glass (SOG), or a spin-on dielectric (SOD) material.

The insulating protective layer 18 may be formed as a plurality of layers as needed. The plurality of layers may be formed of different materials or may be formed of the same material.

The insulating protective layer 18 may support first and second electrodes 19a and 19b (to be described hereinafter), as well as covering and protecting the exposed light emitting nanostructure 15. The configuration of filling the space between the light emitting nanostructures is not limited thereto. For example, in a different configuration, an electrode element related to the contact electrode 16 may fill the entirety or a portion of the space between the light emitting nanostructures 15.

The nanostructure semiconductor light emitting device 10 may include first and second electrodes 19a and 19b. The first electrode 19a may be disposed in a partially exposed region of the base layer 12 formed of the first conductivity-type semiconductor. Also, the second electrode 19b may be disposed in an exposed region extending from the contact electrode 16.

The dielectric nanocore 14b will hereinafter be described in more detail.

The dielectric nanocore 14b may be formed to have a rod shape formed of a light-transmissive material. The light-transmissive material may include $SiO_x$, $SiN_x$, $Al_2O_3$, HfO, $TiO_2$, $Ta_2O_3$, and the like. Also, the dielectric nanocore 14b may be formed of a material having a refractive index lower than that of the first conductivity-type semiconductor layer 15a (approximately 2.5 in case of GaN). This is because, the difference in the refractive indices between the first conductivity-type semiconductor layer 15a and the dielectric nanocore 14b may change an optical path as described hereinafter. For example, in the present example embodiment, the dielectric nanocore 14b may be formed of a material having a refractive index ranging from about 1.5 to about 2.3. However, the material used to form the dielectric nanocore 14b is not limited thereto and, the dielectric nanocore 14b may be formed of a conductive material according to example embodiments.

The dielectric nanocore 14b may be formed to have a flat upper surface, or an irregular upper surface, or a curved upper surface.

The dielectric nanocore 14b may be formed to have various shapes and dispositions. For example, the dielectric nanocore 14b may have a circular or polygonal cross-sectional shape, and may have a space portion therein. Also, a plurality of dielectric nanocores may be disposed to surround a single dielectric nanocore.

In FIG. 6, various examples of the dielectric nanocore 14b are illustrated.

Figure 6A:
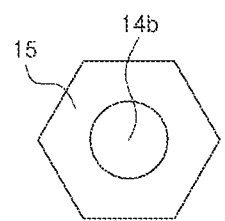
FIG. 6(a)-6(h) are plan views illustrating various forms of a dielectric nanocore of FIG. 1.
Figure 6B:
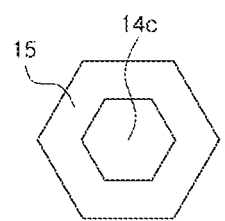
Figure 6C:
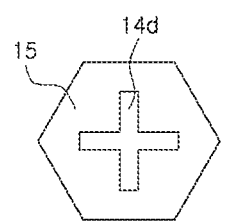
Figure 6D:
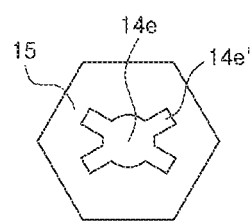
Figure 6E:
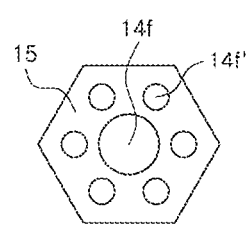
Figure 6F:
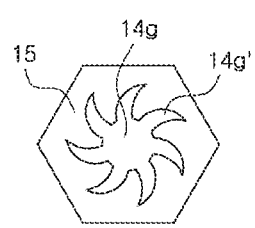
Figure 6G:
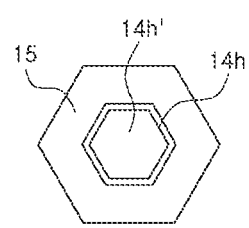
Figure 6H:
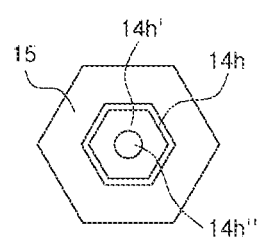

FIG. 6(a) illustrates an example in which a cross-section of the dielectric nanocore 14b has a circular shape. FIG. 6(b) illustrates an example in which a cross-section of a dielectric nanocore 14c has a polygonal shape. FIG. 6(c) illustrates an example in which a cross-section of the dielectric nanocore 14d has a cross (+) shape. FIG. 6(d) illustrates an example in which a dielectric nanocore 14e having a circular cross-section has a plurality of protrusions 14e'. FIG. 6(e) illustrates an example in which a plurality of dielectric nanocores 14f' surround a single dielectric nanocore 14f. FIG. 6(f) illustrates an example in which protrusions 14g' of a dielectric nanocore 14g has a predetermined and/or desired curved surface. FIG. 6(g) illustrates an example in which a dielectric nanocore 14h has a tubular structure in which a space portion 14h' is provided therein. The space portion 14h' may be filled with a first conductivity-type semiconductor layer or air. When the space portion 14h' is filled with air, a phenomenon in which light absorbed by the dielectric nanocore 14h is lost within the dielectric nanocore 14h is reduced, further enhancing external light extraction efficiency. FIG. 6(h) illustrates an example in which a dielectric nanocore 14h'' is further disposed in the space portion 14h' of the dielectric nanocore 14h of FIG. 6(g).

The dielectric nanocore 14b has a rod shape, and thus, lateral surfaces of the dielectric nanocore 14b may be perpendicular or may be sloped with respect to the plane on which the insulating layer 13 is disposed. In particular, when the dielectric nanocore 14b is formed to have lateral surfaces downwardly sloped with respect to the plane on which the insulating layer 13a is disposed, a probability in which light emitted from the active layer 15b is reflected from the lateral surfaces of the dielectric nanocore 14b to be oriented toward an upper surface of the nanostructure semiconductor light emitting device 10 increases, further enhancing external light extraction efficiency.

The dielectric nanocore 14b may be formed of a material having the same composition overall, or may be formed to have a multilayer structure.

Figure 4:
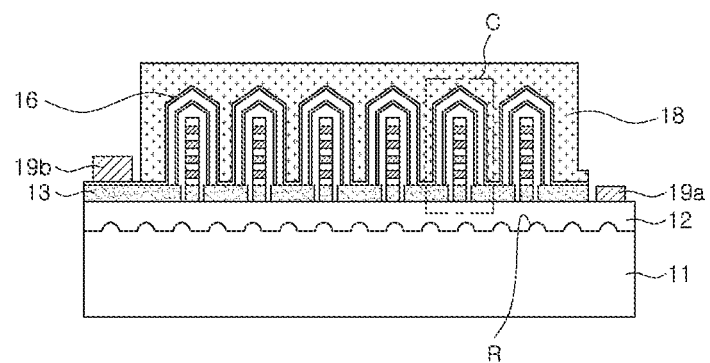
FIG. 4 is a cross-sectional view illustrating a nanostructure semiconductor light emitting device according to another example embodiment of the present inventive concepts.
Figure 5:
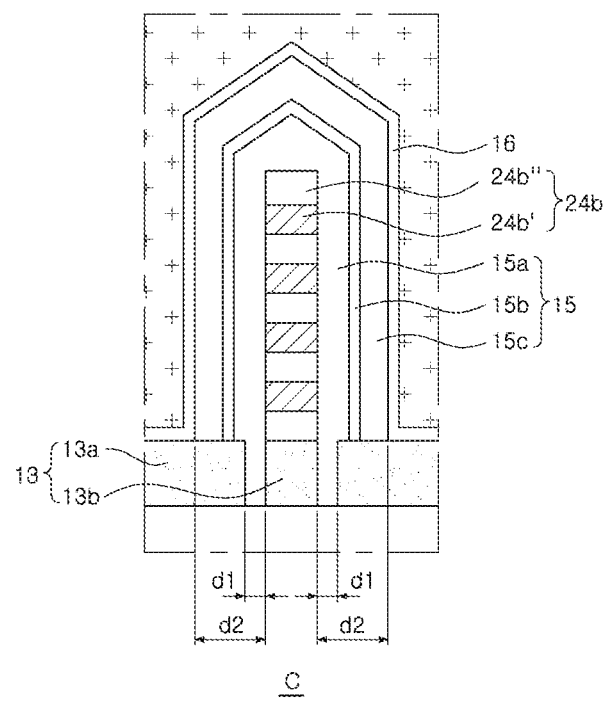
FIG. 5 is an enlarged view of portion "C" of FIG. 4.

For example, as illustrated in FIGS. 4 and 5, a dielectric nanocore 24b may have a multilayer structure in which a plurality of material layers 24b' and 24b'' are stacked to be parallel to the insulating layer 13.

Here, the material layers 24b' and 24b'' forming the multilayer structure may be formed of materials having different refractive indices, and material layers having different refractive indices may be alternately stacked. Also, the dielectric nanocore 24b may be provided to have a distributed Bragg reflector (DBR) structure by appropriately adjusting thicknesses and refractive indices of the material layers.

For example, when a wavelength of light generated by the active layer 15b is $\lambda$ and n is a refractive index of each material layer, each material layer 24b' or 24b'' may have a thickness equal to $\lambda/4n$, specifically, a thickness ranging from about 300 Å to 900 Å. In example embodiments, thicknesses for refractive indices of the material layers 24b' and 24b'' may be selected such that the material layers 24b' and 24b'' have a high level of reflectivity (95% or greater) with respect to a wavelength of light generated by the active layer 15b. Also, a refractive index of each material layer 24b' or 24b'' may be determined within a range from about 1.5 to about 2.3 and may have a value smaller than that of the first conductivity-type semiconductor layer 15b.

The dielectric nanocore 14b having the foregoing configuration may have an effect of enhancing external light extraction efficiency by reflecting and refracting light emitted from the active layer 15b. This will be described in detail with reference to FIG. 7.

Figure 7A:
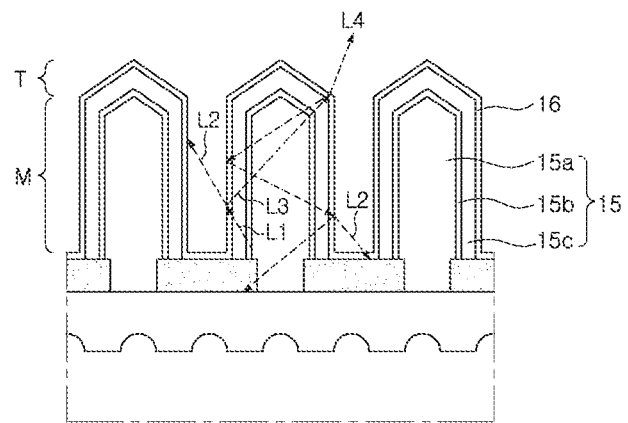
FIGS. 7(a), 7(b), 8(a), and 8(b) are views schematically illustrating a principle of enhancing external light extraction of a nanostructure semiconductor light emitting device according to an example embodiment of the present inventive concepts.
Figure 7B:
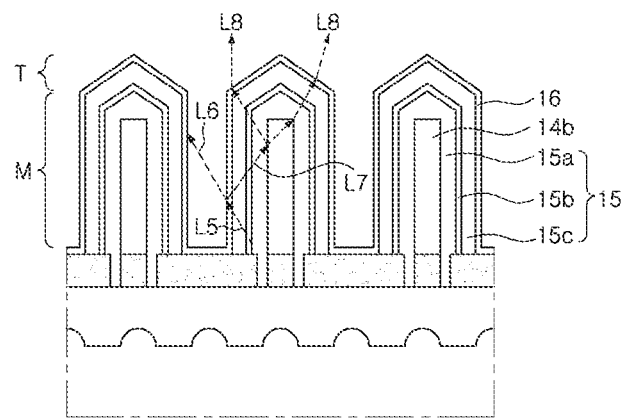

FIGS. 7(a) and 7(b) are views schematically illustrating a principle of enhancing external light extraction efficiency of a nanostructure semiconductor light emitting device according to the present example embodiment.

FIG. 7(a) is a cross-sectional view of a comparative example without the dielectric nanocore 14b, while FIG. 7(b) is a cross-sectional view of a nanostructure semiconductor light emitting device according to example embodiments.

In general, a light emitting nanostructure has an elongated rod shape, and thus, light is mostly emitted from the active layer 15b disposed in the main part M, the lateral surfaces of the light emitting nanostructure 15. A large portion of the light emitted from the active layer 15b disposed in the main part M of the light emitting nanostructure 15 moves toward the adjacent light emitting nanostructure 15. Light reaching the surface of the adjacent light emitting nanostructure 15 is absorbed by or reflected from the surface of the adjacent light emitting nanostructure 15, leading to loss of light.

In a case in which the a dielectric nanocore is not provided as illustrated in FIG. 7(a), light L1 emitted from the active layer 15b is emitted from the surface of the light emitting nanostructure 15 outwardly (L2) or internally reflected (L3). The internally reflected light L3 makes loss of light within the light emitting nanostructure 15, and light L2, among light emitted outwardly, moving to the adjacent light emitting nanostructure 15 is also reflected again from the surface of the adjacent light emitting nanostructure 15 or absorbed by the light emitting nanostructure 15, leading to loss of light. Thus, effective light affecting light output is limited to light L4 moving upwardly from the light emitting nanostructure 15.

Thus, in order to reduce light loss to enhance light output, an optical path should be changed such that light emitted from the active layer 15b moves upwardly from the light emitting nanostructure 15.

In example embodiments, as illustrated in FIG. 7(b), the dielectric nanocore 14b is disposed within the light emitting nanostructure 15 to refract light L7, among light L5 emitted from the active layer 15b, which is reflected to the interior of the light emitting nanostructure 15, such that it moves upwardly from the light emitting nanostructure 15. Thus, as compared with the case in which the dielectric nanocore 14b is not present, the quantity of light L8 moving upwardly from the light emitting nanostructure 15 increases, enhancing light output.

Also, the nanostructure semiconductor light emitting device according to example embodiments may reduce leakage current to enhance external light extraction efficiency, and reduce dispersion of a wavelength of emitted light. This will be described in detail with reference to FIGS. 8 and 14.

Figure 8A:
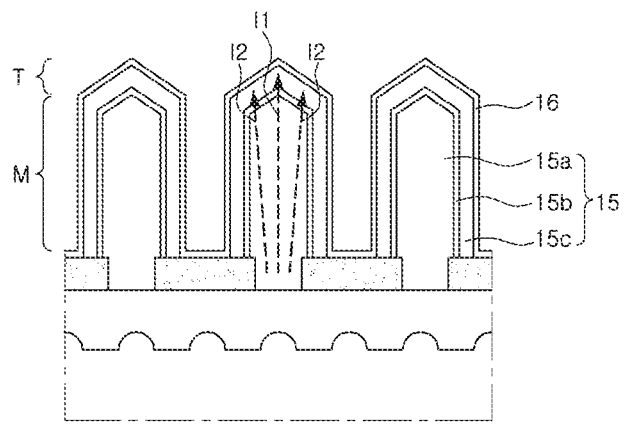
Figure 8B:
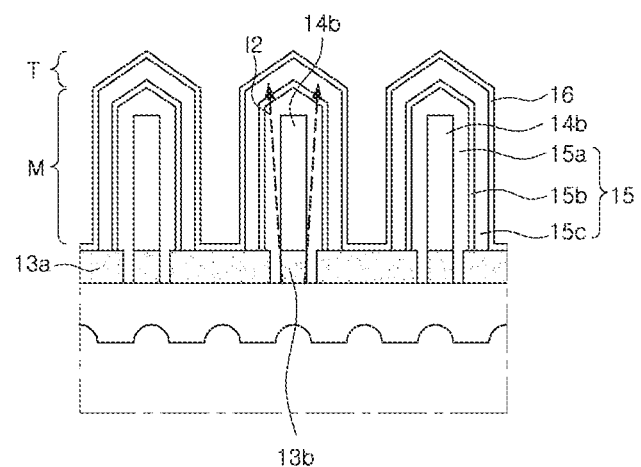
Figure 14:
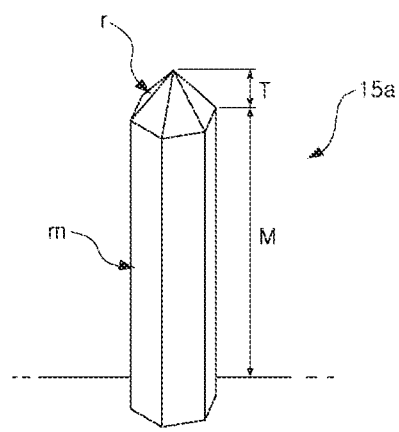
FIG. 14 is perspective views schematically illustrating an example of a first conductivity-type semiconductor layer employed in an example embodiment of the present inventive concepts.

FIGS. 8(a) and 8(b) are views schematically illustrating a principle of enhancing external light extraction of a nanostructure semiconductor light emitting device according to an example embodiment of the present inventive concepts, and FIG. 14 is perspective views schematically illustrating an example of a nanocore formed as a first conductivity-type semiconductor layer employed in an example embodiment of the present inventive concepts.

The first conductivity-type semiconductor layer 15a of the light emitting nanostructure 15 illustrated in FIG. 14 may include a main part M providing a lateral surface having a first crystal plane and a tip portion T providing a surface having a second crystal plane different from the first crystal plane.

In a case in which the first conductivity-type semiconductor layer 15a has a crystal structure having a hexagonal system such as a nitride single crystal, the first crystal plane may be a non-polar plane (m plane) and the second crystal plane may be a plurality of semi-polar planes (r planes). The first conductivity-type semiconductor layer 15a may be understood as having a rod structure in which the tip portion T has a hexagonal pyramidal shape.

Even in a case that an active layer is grown on the surface of the first conductivity-type semiconductor layer 15a using the same process, compositions of the active layer (in particular, the content of indium when InGaN layer is grown) are varied due to the difference between the characteristics of the crystal planes, and a wavelength of light generated by the active layer portion grown on the tip portion of the first conductivity-type semiconductor layer 15a and a wavelength of light generated by the lateral surface (m plane) of the first conductivity-type semiconductor layer 15a may be different. As a result, a half-width of the wavelength of emitted light increases, making it difficult to accurately design light having a desired wavelength. Also, since semiconductor layers (the active layer 15b and the second conductivity-type semiconductor layer 15c) are grown to be relatively thin in the tip portion as a semi-polar plane, a leakage current may be concentrated.

FIG. 8(a) illustrates a current flow within the light emitting nanostructure 15 according to Comparative Example without a dielectric nanocore, and FIG. 8(b) illustrates a current flow within the light emitting nanostructure 15 according to example embodiments.

In FIG. 8(a), currents moving toward the tip portion T of the first conductivity-type semiconductor layer 15a may be divided into a current I1 flowing in a central region and currents I2 flowing in lateral regions. In particular, it can be seen that the current I1 flowing in the central region moves toward a central region of the tip portion T in which the semiconductor layers are relatively thin. Such a current I1 may act as a leakage current.

In contrast, in FIG. 8(b), it can be seen that the current I1 flowing in the central region of the first conductivity-type semiconductor layer 15a is blocked by the insulating layer 13b and the dielectric nanocore 14b. When the insulating layer 13b is provided, the current I1 flowing in the central region is blocked, reducing a leakage current, and in this case, when the dielectric nanocore 14b is formed of an insulating material, the current I2 flowing in the lateral regions is fundamentally reduced or prevented from becoming the current I1 flowing in the central region, more reliably blocking a leakage current.

As shown in FIGS. 2, 4, 7(b), and 8(b), in example embodiments, the base of each nanocore 14b does not entirely occupy the corresponding opening in the insulating layer 13. In example embodiments as shown in FIGS. 2, 4, 7(b), and 8(b), the base of each nanocore 14b is narrower than the corresponding opening in the insulating layer 13. In example embodiments as shown in FIGS. 2, 4, 7(b), and 8(b), the second region 13b acts as an insulating island on the base layer 12 in each opening, wherein the corresponding nanocore 14b is on the second region 13b. In example embodiments as shown in FIGS. 2, 4, 7(b), and 8(b), the base of each nanocore 14b need not contact the base layer.

Figure 9:
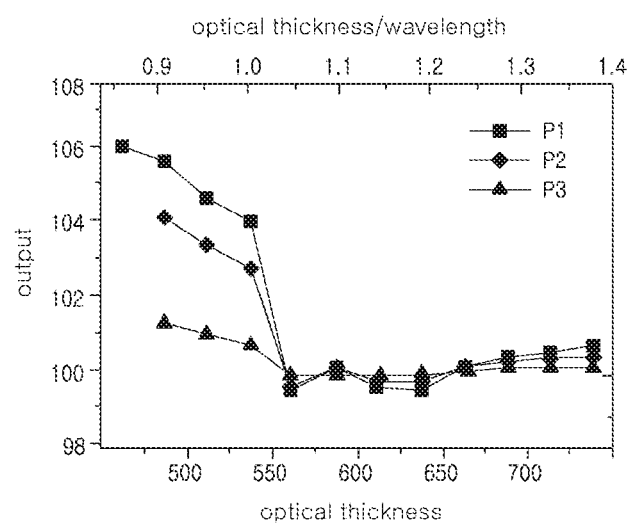
FIG. 9 is a graph illustrating an external light extraction effect according to an example embodiment of the present inventive concepts.

FIG. 9 is a graph illustrating an enhanced external light extraction effect of the dielectric nanocore according to an example embodiment of the present inventive concepts. In FIG. 9, P1 denotes a case in which the dielectric nanocore is formed of a material having a refractive index equal to 1.5, P2 denotes a case in which the dielectric nanocore is formed of a material having a refractive index equal to 1.8, and P3 denotes a case in which the dielectric nanocore is formed of a material having a refractive index equal to 2.3. In FIG. 9, the y axis represents an output value, a relative value, of the nanostructure semiconductor light emitting device. In output values, light output when the dielectric nanocore is not disposed was set to 100. Also, the graph illustrates output values measured when a wavelength of light emitted from the active layer was 535 nm. The lower x axis of the graph represents an optical thickness, which is obtained by multiplying a refractive index and a thickness of the light emitting nanostructure, and the upper x axis represents an optical thickness divided by the wavelength (535 nm).

The graph of FIG. 9 shows that a maximum of about 6% of output was enhanced according to the optical thicknesses when the dielectric nanocore 14b was provided, as compared with the case in which the dielectric nanocore is not disposed (output: 100). Also, it can be seen that the optical output was enhanced as the refractive index of the dielectric nanocore 14b was reduced (P1<P2<P3).

In an example embodiment, it can be seen that the light output was further enhanced when a value obtained by dividing the optical thickness by a wavelength is 1, namely, when the optical thickness of the light emitting nanostructure was equal to the wavelength of light emitted from the active layer 15b. This is because resonance takes place when the wavelength of light emitted from the active layer 15b is equal to the optical thickness. The optical thickness of the light emitting nanostructure is a value obtained by multiplying a refractive index of the light emitting nanostructure 15 to d2 of FIG. 3 or 5.

Figure 10A:
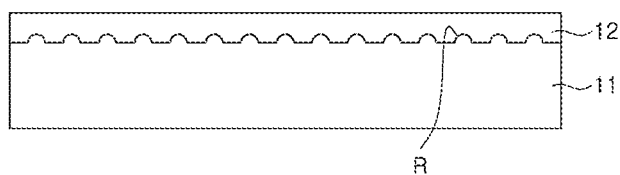
FIGS. 10A through 10C are cross-sectional views illustrating sequential processes of forming dielectric nanocores according to an example embodiment of the present inventive concepts.
Figure 10B:
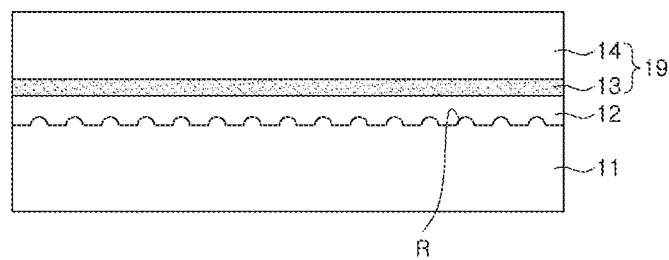
Figure 10C:
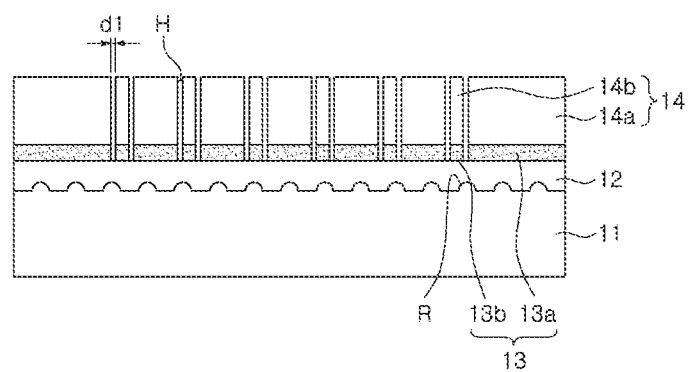

The nanostructure semiconductor light emitting device according to example embodiments may be manufactured through various manufacturing methods. FIGS. 10A through 10C are cross-sectional views illustrating sequential processes of forming dielectric nanocores according to an example embodiment of the present inventive concepts, in which a dielectric nanocore is formed using a mold structure.

First, as illustrated in FIG. 10A, a first conductivity-type semiconductor may be grown on the substrate 11 to provide a base layer 12. In an example embodiment, an irregular pattern R may be formed on an upper surface of the substrate 11.

The base layer 12 provides a crystal growth face for growing light emitting nanostructures and serves to electrically connect polarities of one sides of the light emitting nanostructures. Thus, the base layer 32 is formed as a semiconductor single crystal having electrical conductivity. When the base layer 12 is directly grown, the substrate 11 may be a crystal growth substrate.

Next, as illustrated in FIG. 10B, a mask 19 having an etch stop layer is formed on the base layer 12.

The mask 19 employed in example embodiments may include an insulating layer 13 formed on the base layer 12, and a mold layer 14 formed on the insulating layer 13 and having an etching rate greater than that of the insulating layer 13.

The insulating layer 13 may be provided as an etch stop layer. That is, the insulating layer 13 has an etching rate lower than that of the mold layer 14 under the same etching conditions. At least the insulating layer 13 may be formed of a material having electrical insulating properties, and the mold layer 14 may be formed of an insulating material as needed.

The insulating layer 13 and the mold layer 14 may be formed of different materials to obtain a desired difference in etching rates. For example, the insulating layer 13 may be formed of SiN, and the mold layer 14 may be formed of $SiO_2$. Alternatively, the difference in etching rates may be realized using air gap density. In example embodiments, the insulating layer 13 and the mold layer 14 may be formed of materials having different air gap density.

A total thickness of the insulating layer 13 and the mold layer 14 may be designed in consideration of a height of a light emitting nanostructure desired to be manufactured. An etch stop level by the insulating layer 13 may be designed in consideration of an overall height of the mask from a surface of the base layer 12.

Thereafter, as illustrated in FIG. 10C, a plurality of openings H are formed in the insulating layer 13 and the mold layer 14 to expose the base layer 12 region.

A size of each opening H may be designed in consideration of the size of the light emitting nanostructure desired to be manufactured, and may have a gap d1 sufficient for allowing a first conductivity-type semiconductor layer 15a to be grown therein.

The openings H may be manufacturing using a semiconductor process. For example, openings H having a high aspect ratio may be formed using a deep etching process. The aspect ratio of the openings H may be 5:1 or greater, preferably, 10:1 or greater.

Figure 15:
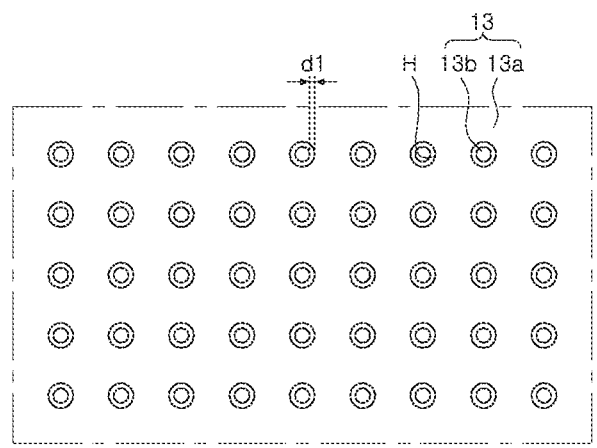
FIG. 15 is a plan view illustrating an insulating layer employed in example embodiment of the present inventive concepts.

The openings H may have various planar shapes and arrangements. For example, in case of a planar shape, the openings H may be variously formed to have an annular shape having a circumference of a circular shape, an oval shape, a polygonal shape or the like. FIG. 15 is a plan view illustrating an insulating layer employed in an example embodiment of the present inventive concepts, in which the openings H are formed to have an annular shape with a circular circumference.

The openings H illustrated in FIG. 10C has a rod structure, but the shape of the openings H is not limited thereto and the openings H may have various structures using an appropriate etching process. For example, openings H having a pillar structure having a shape in which a section area decreases in a direction toward the upper side of the mold layer 14.

Through the openings H, the insulating layer 13 may be divided into a first region 13a and a second region 13b, and the mold layer 14 is divided into a dielectric nanocore 14b and other region 14a. Through this process, the dielectric nanocores 14b are prepared.

Figure 11A:
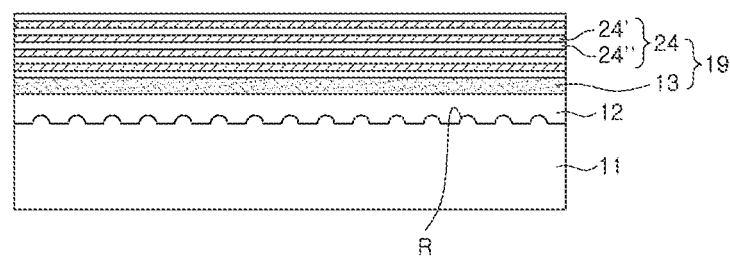
FIGS. 11A and 11B are cross-sectional views illustrating sequential processes of forming dielectric nanocores according to another example embodiment of the present inventive concepts.
Figure 11B:
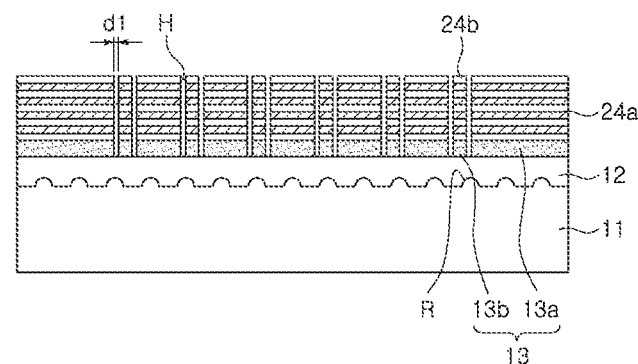

As described above, each dielectric nanocore may have a multilayer structure. An example of forming a dielectric nanocore 24a having a multilayer structure will be described. FIGS. 11A and 11B are cross-sectional views illustrating an example of sequential processes of forming dielectric nanocores. Differences from the previous example embodiment will be largely described.

A substrate 11 on which the base layer 12 of FIG. 10A is formed is prepared, and as illustrated in FIG. 11A, a match 19 having an etch stop layer is formed on the base layer 12.

The mask 19 employed in example embodiments may include an insulating layer 13 and a mold layer 24, and the mold layer 24 may have a multilayer structure, unlike the mold layer 14 described above. The mold layer 24 having a multilayer structure may be formed by alternately depositing material layers 24' and 24" each formed of light-transmissive insulating materials having different refractive indices, repeatedly.

Thereafter, as illustrated in FIG. 11B, a plurality of openings H are formed in the insulating layer 13 and the mold layer 24 to expose the base layer 12. Through this process, dielectric nanocores 24b having a multilayer structure are completed.

Figure 12A:
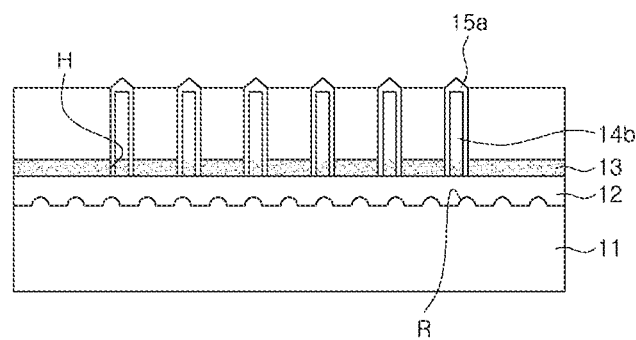
FIGS. 12A through 12C are cross-sectional views illustrating an example of sequential processes of forming light emitting nanostructures with respect to the product illustrated in FIG. 10C.
Figure 12B:
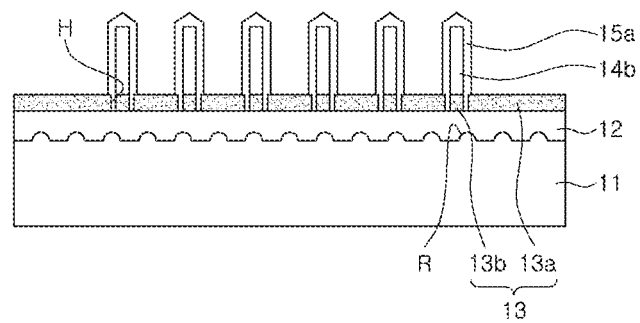
Figure 12C:
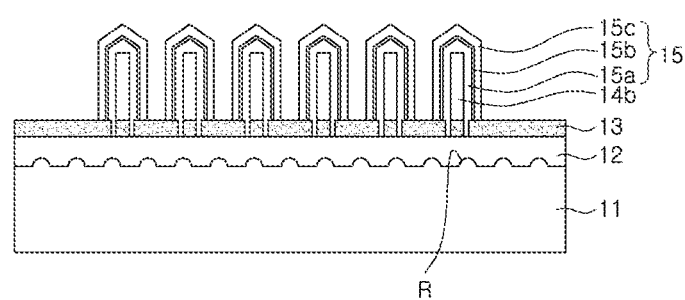

Hereinafter, an example of a process of forming a light emitting nanostructure will be described. FIGS. 12A through 12C are cross-sectional views illustrating an example of sequential processes of forming light emitting nanostructures with respect to the product illustrated in FIG. 10C.

First, as illustrated in FIG. 12A, a first conductivity-type semiconductor is grown on the exposed regions of the base layer 12 such that the plurality of openings H are filled, to form a first conductivity-type semiconductor layer 15a. The conductivity-type semiconductor layer 15a may be an n-type nitride semiconductor and may be formed of the same material as that of the first conductivity-type semiconductor of the base layer 12. For example, the base layer 12 and the first conductivity-type semiconductor layer 15a may be formed of n-type GaN.

The first conductivity-type semiconductor layer 15a may be formed using a metal-organic chemical vapor deposition (MOCVD) or molecular beam epitaxy (MBE), and the insulating layer 13 may serve as a mold of the grown semiconductor layer to provide the first conductivity-type semiconductor layer 15a corresponding to shapes of the openings H. That is, the semiconductor layer is selectively grown on the base layer 12 exposed to the openings H by the insulating layer 13, filling the openings H, and the semiconductor layer filling the openings H may have a shape corresponding to the shape of the openings H.

Subsequently, as illustrated in FIG. 12B, the region 14a of the mold layer 14, excluding the dielectric nanocores 14b, is removed such that lateral surfaces of the plurality of first conductivity-type semiconductor layers 15a are exposed, and thereafter, the first conductivity-type semiconductor layer 15a may be heat-treated.

The removing of the region 14a may be performed through a chemical etching process. In example embodiments, the region 14a may be removed through a wet etching process using a buffered oxide etchant (BOE). Through this process, the dielectric nanocore 14b covered with the first conductivity-type semiconductor layer 15a is prepared.

In example embodiments, in order to enhance crystallinity, an additional heat treatment process may be introduced in the process of manufacturing the light emitting nanostructure using the mask having openings as a mold.

After a portion of the mold layer 14 as an upper layer of the insulating layer 13 is removed, the surface of the first conductivity-type semiconductor layer 15a is heat-treated under predetermined and/or desired conditions to change the crystal faces of the first conductivity-type semiconductor layer 15a into stable planes advantageous for crystal growth such as a semi-polar crystal plane or a non-polar crystal plane.

The first conductivity-type semiconductor layer 15a may have crystal planes determined according to the shape of the openings H. Although varied according to shapes of the openings, the surface of the first conductivity-type semiconductor layer 15a has relatively unstable crystal planes, and this may not be conditions advantageous for a follow-up crystal growth.

In example embodiments, when the openings have a cylindrical rod shape, the lateral surfaces of the first conductivity-type semiconductor layer 15a may have a curved surface, rather than a particular crystal plane. When such a first conductivity-type semiconductor layer 15a is heat-treated, the unstable crystals thereof are re-arranged to have stable crystal planes such as semi-polar planes or non-polar planes. Heat treatment conditions may be executed at a temperature equal to at least 800° C. for a few minutes to tens of minutes to change the surface into desired stable crystal planes.

For example, in a case in which the first conductivity-type semiconductor layer 15a is grown using the C(0001) plane of the sapphire substrate, the first conductivity-type semiconductor layer 15a may be heat-treated at a temperature equal to or higher than 800° C. to change the curved surface of the unstable crystal planes into non-polar surfaces (m planes). The process of stabilizing the crystal planes may be realized through a high temperature heat treatment process. This principle may be understood that, when crystals positioned on the surface are rearranged at a high temperature or a source gas remains within a chamber, such a residual source gas is deposited to perform partial regrowth to have stable crystal planes.

For example, in the case of regrowth, a heat treatment process may be performed under an atmosphere with a residual source gas in a chamber, or a heat treatment process may be performed under conditions that a small amount of source gas is supplied on purpose. The heat treatment process may be performed under conditions similar to the conditions for forming the first conductivity-type semiconductor layer in the MOCVD after removing the mask, and surface quality of the light emitting nanostructures may be enhanced. That is, through this heat treatment process, non-uniformities (for example, defects, or the like) present on the surfaces of first conductivity-type semiconductor layer manufactured after the removal of the mask may be removed and the configuration may be controlled to have a stable structure (for example, a hexagonal column). The heat-treatment process may be performed under conditions similar to those of the process of growing the first conductivity-type semiconductor layer, for example, at a temperature ranging from 800° C. to 1200° C., and here, a size of the heat-treated first conductivity-type semiconductor layer 15a may slightly increase due to the regrowth.

Subsequently, as illustrated FIG. 12C, an active layer 15b and a second conductivity-type semiconductor layer 15c are sequentially grown on the surfaces of the plurality of first conductivity-type semiconductor layers 15a.

Through this process, the light emitting nanostructure may have a core-shell structure including the first conductivity-type semiconductor layer 15a and shell layers including the active layer 15b and the second conductivity-type semiconductor layer 15c covering the first conductivity-type semiconductor layer 15a.

Electrodes having various structures may be formed in the light emitting nanostructures 15 illustrated in FIG. 12C. FIGS. 13A through 13D are cross-sectional views illustrating an example of sequential processes of forming an electrode with respect to the product illustrated in FIG. 12C.

First, a contact electrode 16 is formed on the light emitting nanostructures 15 obtained in FIG. 12C.

The contact electrode 16 may include an appropriate material realizing ohmic-contact with the second conductivity-type semiconductor layer 15c on surfaces of the light emitting nanostructures 15. The material for ohmic-contact may include GaN, InGaN, ZnO or graphene. The material for ohmic-contact may include Ag, Ni, Al, Rh, Pd, Ir, Ru, Mg, Zn, Pt, and Au, and may have a structure including two or more layers such as Ni/Ag, Zn/Ag, Ni/Al, Zn/Al, Pd/Ag, Pd/Al, Ir/Ag. Ir/Au, Pt/Ag, Pt/Al, or Ni/Ag/Pt. In a specific example, the contact electrode 16 may be formed by applying an electroplating process to the material for ohmic-contact used as a seed layer. For example, after an Ag/Ni/Cr layer is formed as a seed layer, Cu/Ni may be electroplated to form the desired contact electrode 16.

The contact electrode 16 used in example embodiments may be a reflective metal layer and light is extracted in a direction toward the substrate, but the material of the contact electrode 16 is not limited thereto and the contact electrode 16 may be formed of a transparent electrode material such as indium tin oxide (ITO) to extract light in a direction toward the light emitting nanostructures 15.

Figure 13A:
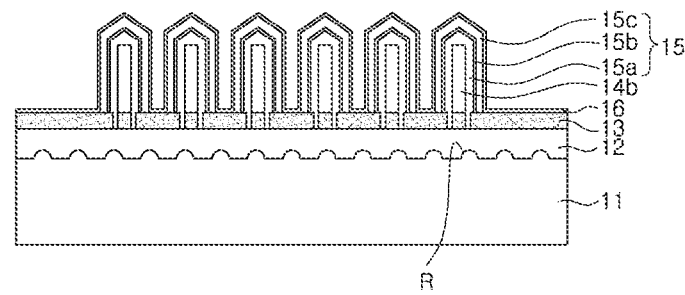
FIGS. 13A through 13D are cross-sectional views illustrating an example of sequential processes of forming an electrode with respect to the product illustrated in FIG. 12C.
Figure 13B:
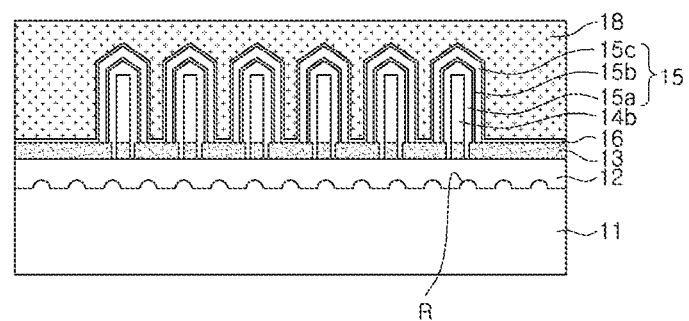

Thereafter, as illustrated in FIG. 13B, an insulating protective layer 18 is formed to cover the upper portion of the light emitting nanostructures 15. The insulating protective layer 18 may be formed of various electrical insulating materials. The insulating protective layer 18 may be formed of an insulating material such as $SiO_2$ or $SiN_x$. In detail, the insulating protective layer 18 may be formed of tetraethyl-orthosilane (TEOS), borophosphor silicate glass (BPSG), CVD-SiO$_2$, spin-on glass (SOG), or a spin-on dielectric (SOD) material in order to fill the spaces between the light emitting nanostructures 15.

Figure 13C:
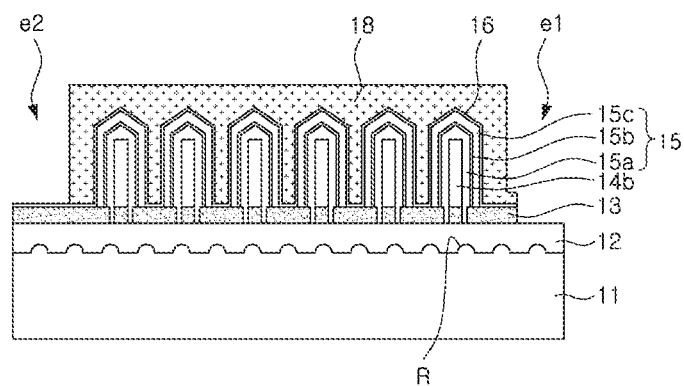

As illustrated in FIG. 13C, the insulating protective layer 18 is selectively removed to expose portions of the base layer 12 and the contact electrode 16 to provide an electrode formation region e1. In addition, a region e2 for forming a second electrode may be provided. As the selective etching process performed on the insulating protective layer 18, dry etching or wet etching may be used. For example, in a case in which the insulating protective layer 18 is an oxide film or similar, the dry etching may utilize CF-based plasma, and in the case of wet etching, an HF-contained etchant such as a buffered oxide etchant (BOE) may be used.

Figure 13D:
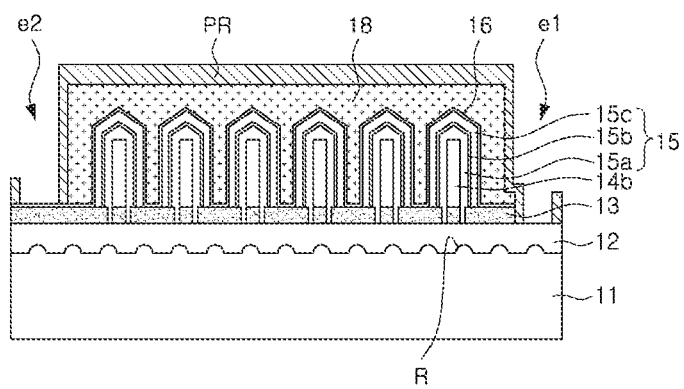

Thereafter, as illustrated in FIG. 13D, the region e1 in which a first electrode is to be formed may be defined. In this process, as the region e1 in which the first electrode is to be formed, a portion of the base layer 12 may be exposed.

The exposed region e1 may be provided as a region for forming the first electrode. The removal process may be performed using a photolithography process. In this process, a portion of the light emitting nanostructures 15 positioned in the region e1 desired to be exposed may be removed, or alternatively, the first conductivity-type semiconductor layer 15a may not be grown in the region in which the electrode is to be formed, and in this case, the light emitting nanostructure 15 may not be removed together.

Thereafter, as illustrated in FIG. 13D, photoresist PR is formed such that the contact regions e1 and e2 of the first and second electrodes are defined. Subsequently, the first electrode 19a and the second electrode 19b as illustrated in FIG. 2 may be formed in the e1 region and the e2 region, respectively. As an electrode material used in this process, a common electrode material of the first and second electrodes 19a and 19b may be used. For example, the material for the first and second electrodes 19a and 19b may include Au, Ag, Al, Ti, W, Cu, Sn, Ni, Pt, Cr, Sn, TiW, AuSn, or a eutectic metal thereof.

The nanostructure semiconductor light emitting device according to example embodiments described above may be realized as various packages.

Figure 16:
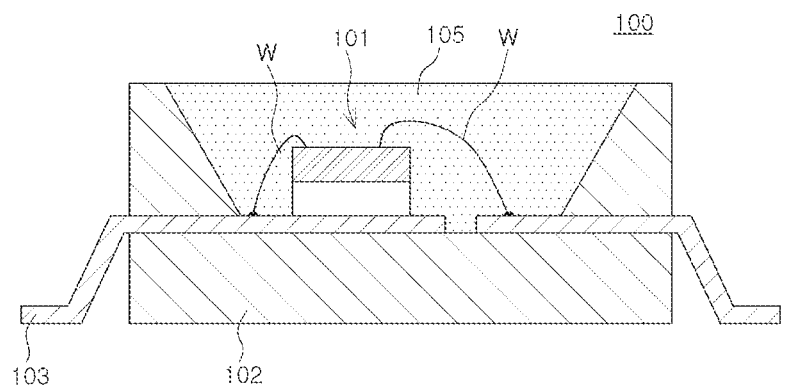
FIGS. 16 and 17 are views illustrating various examples of a nanostructure semiconductor light emitting device package employing a semiconductor light emitting device according to an example embodiment of the present inventive concepts.
Figure 17:
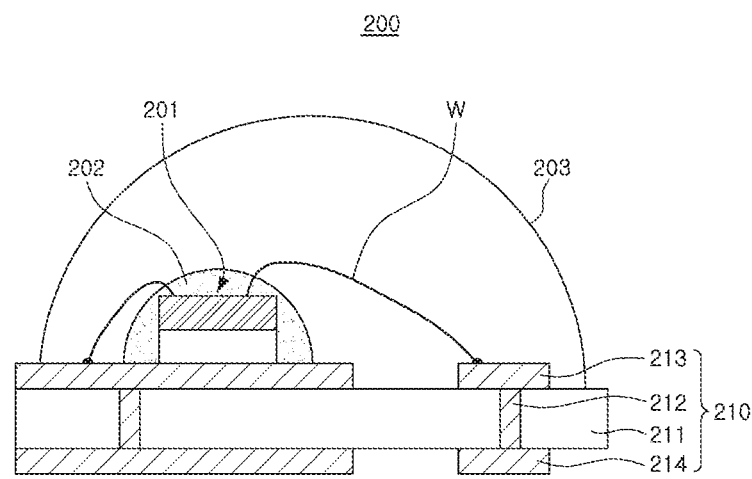

FIGS. 16 and 17 are views illustrating various examples of a nanostructure semiconductor light emitting device package employing the semiconductor light emitting device described above. However, the structure in which the nanostructure semiconductor light emitting device is mounted is not limited to the illustrated structure and the nanostructure semiconductor light emitting device may also be mounted in a so-called flipchip structure in which electrodes are disposed to face a mounting surface of a package body.

A semiconductor light emitting device package 100 may include a semiconductor light emitting device 101, a package body 102, and a pair of lead frames 103.

The semiconductor light emitting device 101 may be the nanostructure semiconductor light emitting device described above. The semiconductor light emitting device 101 may be mounted on the lead frame 103 and electrically connected to the lead frames 103 through wires.

If necessary, the semiconductor light emitting device 101 may be mounted on a different region, for example, on a package body 102, rather than on the lead frame 103. Also, the package body 102 may have a cup shape to improve reflectivity efficiency of light. An encapsulant 105 formed of a light-transmissive material may be formed in the reflective cup to encapsulate the semiconductor light emitting device 101, the wire W, and the like.

A semiconductor light emitting device package 200 illustrated in FIG. 17 may include a semiconductor light emitting device 201, a mounting board 210, and an encapsulant 203.

A wavelength conversion unit 202 may be formed on an upper surface and lateral surfaces of the semiconductor light emitting device 201. The semiconductor light emitting device 201 may be mounted on the mounting board 210 and electrically connected to the mounting board 210 through a wire W.

The mounting board 210 may include a board main body 211, an upper electrode 213, a lower electrode 214, and a through electrode 212 connecting the upper electrode 213 and the lower electrode 214. The mounting board 210 may be provided as a board such as printed circuit board (PCB), metal-core printed circuit board (MCPCB), a metal base printed circuit board (MPCB), a flexible printed circuit board (FPCB), or the like, and the structure of the mounting board 210 may have various forms.

The wavelength conversion unit 202 may include a phosphor, a quantum dot, or the like. The encapsulant 203 may be formed to have a lens structure with an upper surface having a convex dome shape. However, according to an example embodiment, the encapsulant 203 may have a lens structure having a convex or concave surface to adjust a beam angle of light emitted through an upper surface of the encapsulant 203.

The nanostructure semiconductor light emitting device and a package having the same according to example embodiments as described above may be advantageously applied to various application products.

Figure 18:
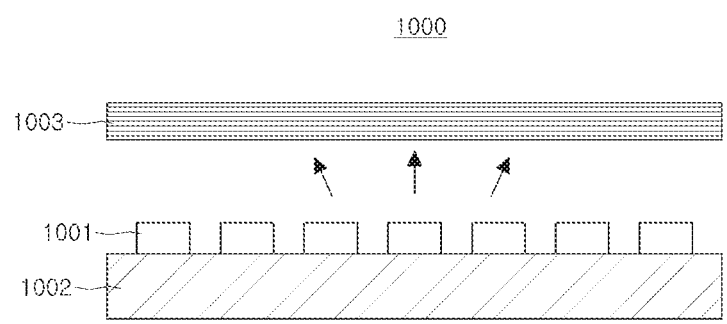
FIGS. 18 and 19 are views illustrating a backlight unit employing a nanostructure semiconductor light emitting element according to an example embodiment of the present inventive concepts.
Figure 19:
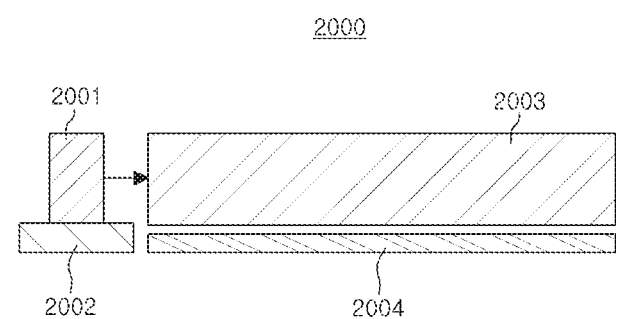

FIGS. 18 and 19 are views illustrating a backlight unit employing a nanostructure semiconductor light emitting device according to an example embodiment of the present inventive concepts.

Referring to FIG. 18, a backlight unit 1000 includes light sources 1001 mounted on a board 1002 and one or more optical sheets 1003 disposed above the light sources 1001. The aforementioned semiconductor light emitting device or a package employing the semiconductor light emitting device may be used as the light sources 1001.

Unlike the backlight unit 1000 in FIG. 18 in which the light sources 1001 emit light upwardly where a liquid crystal display is disposed, a backlight unit 2000 as another example illustrated in FIG. 19 is configured such that light sources 2001 mounted on a board 2002 emit light in a lateral direction, and the emitted light may be incident to a light guide plate 2003 so as to be converted into a surface light source. Light, passing through the light guide plate 2003, is emitted upwardly, and here, in order to enhance light extraction efficiency, a reflective layer 2004 may be disposed on a lower surface of the light guide plate 2003.

Figure 20:
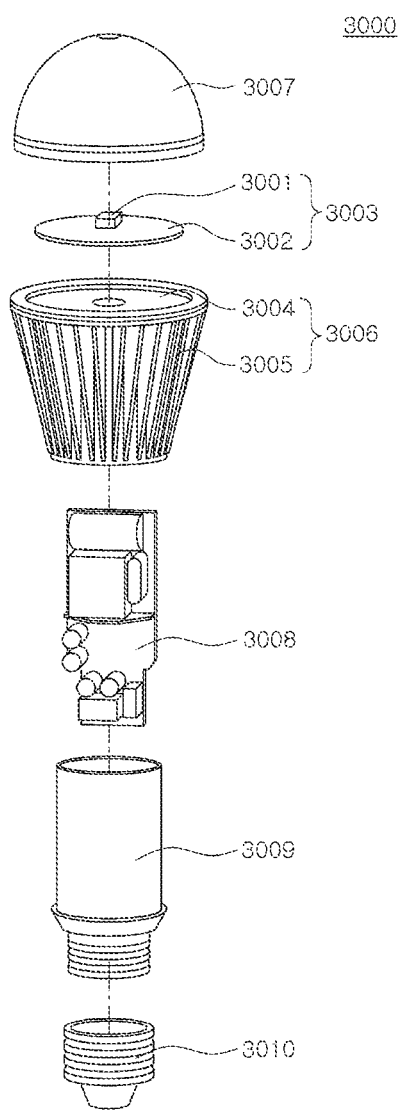
FIG. 20 is a view illustrating an example of a lighting device employing a nanostructure semiconductor light emitting element according to an example embodiment of the present inventive concepts.

FIG. 20 is an exploded perspective view illustrating an example of a lighting device employing a semiconductor light emitting device package thereof according to an example embodiment of the present inventive concepts.

A lighting device 3000 is illustrated, for example, as a bulb-type lamp in FIG. 20, and includes a light emitting module 3003, a driving unit 3008, and an external connection unit 3010.

Also, the lighting device 3000 may further include external structures such as external and internal housings 3006 and 3009 and a cover unit 3007. The light emitting module 3003 may include a light source 3001 having the aforementioned semiconductor light emitting device package structure or a structure similar thereto and a circuit board 3002 on which the light source 3001 is mounted. For example, the first and second electrodes of the aforementioned semiconductor light emitting device may be electrically connected to an electrode pattern of the circuit board 3002. In the present example embodiment, it is illustrated that a single light source 3001 is mounted on the circuit board 3002, but a plurality of light sources may be mounted as needed.

The external housing 3006 may serve as a heat dissipation unit and may include a heat dissipation plate 3004 disposed to be in direct contact with the light emitting module 3003 to enhance heat dissipation and heat dissipation fins 3005 surrounding the lateral surfaces of the lighting device 3000. The cover unit 3007 may be installed on the light emitting module 3003 and have a convex lens shape. The driving unit 3008 is installed in the internal housing 3009 and connected to the external connection unit 3010 having a socket structure to receive power from an external power source. Also, the driving unit 3008 may serve to convert power into an appropriate current source for driving the semiconductor light emitting device 3001 of the light emitting module 3003, and provide the same. For example, the driving unit 3008 may be configured as an AC-DC converter, a rectifying circuit component, or the like.

Figure 21:
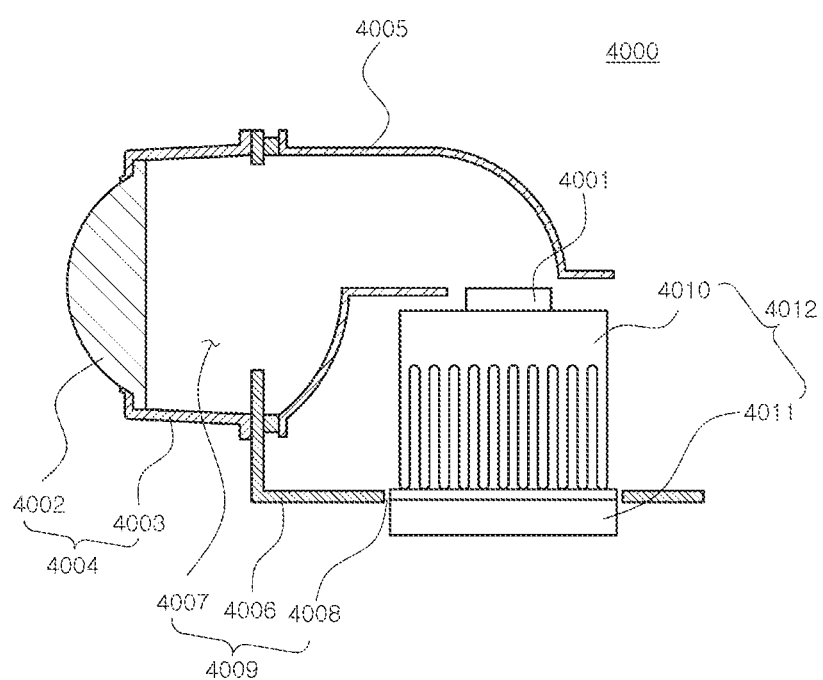
FIG. 21 is a view illustrating an example of a headlamp employing a semiconductor light emitting element according to an example embodiment of the present inventive concepts.

FIG. 21 is a view illustrating an example of a lighting device employing a semiconductor light emitting device according to an example embodiment of the present inventive concepts.

Referring to FIG. 21, a headlamp 4000 used as a vehicle lamp, or the like, may include a light source 4001, a reflective unit 4005, and a lens cover unit 4004. The lens cover unit 4004 may include a hollow guide 4003 and a lens 4002. The light source 4001 may include the aforementioned semiconductor light emitting device or a package including the semiconductor light emitting device.

The headlamp 4000 may further include a heat dissipation unit 4012 outwardly dissipating heat generated by the light source 4001. In order to effectively dissipate heat, the heat dissipation unit 4012 may include a heat sink 4010 and a cooling fan 4011. Also, the headlamp 4000 may further include a housing 4009 fixedly supporting the heat dissipation unit 4012 and the reflective unit 4005, and the housing 4009 may have a body unit 4006 and a central hole 4008 formed in one surface thereof, in which the heat dissipation unit 4012 is coupled.

Also, the housing 4009 may have a front hole 4007 formed in the other surface integrally connected to the one surface and bent in a right angle direction. The front hole 4007 may allow the reflective unit 4005 to be fixedly positioned above the light source 4001. Accordingly, a front side is opened by the reflective unit 4005, and the reflective unit 4005 is fixed to the housing 4009 such that the opened front side corresponds to the front hole 4007, and light reflected by the reflective unit 4005 may pass through the front hole 4007 to be output outwardly.

As set forth above, according to example embodiments of the present inventive concepts, the absorption of light emitted from one light emitting nanostructure by an adjacent light emitting nanostructure may be alleviated.

Also, a change in a wavelength of emitted light and a leakage current caused due to the light emitting nanostructures may be alleviated.

While example embodiments have been shown and described above, it will be apparent to those skilled in the art that modifications and variations could be made without departing from the scope of the invention as defined by the appended claims.

Additionally, each of the features described above may be combined in any appropriate manner to obtain nanostructure semiconductor light emitting devices, light emitting nanostructures, methods, and/or apparatuses with various combinations of features. In this regard, U.S. application Ser. No. 14/551,978, filed Nov. 24, 2014; Ser. No. 14/723,869, filed May 28, 2015; Ser. No. 13/599,430, filed Aug. 30, 2012; Ser. No. 14/501,232, filed Sep. 30, 2014; U.S. application Ser. No. 14/828,004, filed Aug. 17, 2015; U.S. application Ser. No. 14/833,832, filed Aug. 24, 2015; U.S. application Ser. No. 14/838,322, filed on Aug. 27, 2015; U.S. application Ser. No. 14/838,635, filed on Aug. 28, 2015; U.S. application Ser. No. 14/867,659, filed on Sep. 28, 2015; U.S. application Ser. No. 14/877,466, filed on Oct. 20, 2015; and U.S. application Ser. No. 14/920,509, filed on Oct. 22, 2015, are each hereby incorporated by reference in their entirety, thereby disclosing additional nanostructure semiconductor light emitting devices, light emitting nanostructures, methods, and/or apparatuses with various additional combinations of features.

What is claimed is:

1. A nanostructure semiconductor light emitting device comprising:
a base layer of a first conductivity-type semiconductor;
an insulating layer on an upper surface of the base layer and including a first region having a plurality of openings and a plurality of second regions in the plurality of openings and spaced apart from the first region;
dielectric nanocores in the plurality of second regions; and
a plurality of light emitting nanostructures each including a first conductivity-type semiconductor layer, an active layer, and a second conductivity-type semiconductor layer sequentially on the dielectric nanocores.

2. The nanostructure semiconductor light emitting device of claim 1, wherein the base layer is exposed to regions between the first region and the second regions.

3. The nanostructure semiconductor light emitting device of claim 2, wherein the regions between the first region and the second regions are filled with the first conductivity-type semiconductor layer.

4. The nanostructure semiconductor light emitting device of claim 1, wherein the dielectric nanocores and the insulating layer are of different materials.

5. The nanostructure semiconductor light emitting device of claim 1, wherein the dielectric nanocores has a multilayer structure.

6. The nanostructure semiconductor light emitting device of claim 5, wherein the multilayer structure includes alternately stacked material layers having different refractive indices.

7. The nanostructure semiconductor light emitting device of claim 6, wherein the multilayer structure is a distributed Bragg reflector (DBR) structure.

8. The nanostructure semiconductor light emitting device of claim 1, wherein the dielectric nanocores have a circular or polygonal cross-sectional shape with respect to a plane intersecting therewith, parallel to the insulating layer.

9. The nanostructure semiconductor light emitting device of claim 1, wherein the cross-section of the dielectric nanocores has substantially the same shape as that of the second regions of the insulating layer.

10. The nanostructure semiconductor light emitting device of claim 1, wherein the dielectric nanocores are of a light-transmissive material.

11. The nanostructure semiconductor light emitting device of claim 1, wherein the dielectric nanocores have a flat upper surface.

12. A nanostructure semiconductor light emitting device comprising:

a base layer of a first conductivity-type semiconductor;

a first insulating layer on the base layer and including a plurality of openings exposing portions of the base layers;

a second insulating layer spaced apart from the first insulating layer within the plurality of openings and including a material having the same composition as the first insulating layer;

dielectric nanocores on the second insulating layer; and a plurality of light emitting nanostructures each including a first conductivity-type semiconductor layer, an active layer, and a second conductivity-type semiconductor layer sequentially on the dielectric nanocores.

13. The nanostructure semiconductor light emitting device of claim 12, wherein a refractive index of the dielectric nanocores is lower than a refractive index of the first conductivity-type semiconductor layer.

14. The nanostructure semiconductor light emitting device of claim 12, wherein the first insulating layer and the second insulating layer have substantially the same thickness.

15. The nanostructure semiconductor light emitting device of claim 12, wherein the dielectric nanocores are of an insulating material.

16. A nanostructure semiconductor light emitting device comprising:

a base layer;

an insulating layer on the base layer, the insulating layer including a plurality of openings exposing the base layer; and a dielectric nanocore associated with each of the plurality of openings, wherein a base of each nanocore does not entirely occupy the corresponding opening.

17. The nanostructure semiconductor light emitting device of claim 16, wherein the base of each nanocore is narrower than the corresponding opening.

18. The nanostructure semiconductor light emitting device of claim 16, further comprising an insulating island on the base layer in each opening, wherein the corresponding nanocore is on the insulating island.

19. The nanostructure semiconductor light emitting device of claim 16, wherein the base of each nanocore does not contact the base layer.

20. The nanostructure semiconductor light emitting device of claim 16, wherein each nanocore has a multilayer structure and the multilayer structure includes alternately stacked material layers having different refractive indices.

* * * * *